United States Patent
Chang

(10) Patent No.: US 8,254,122 B2
(45) Date of Patent: Aug. 28, 2012

(54) DATA CENTER

(75) Inventor: Yao-Ting Chang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 94 days.

(21) Appl. No.: 12/871,853

(22) Filed: Aug. 30, 2010

(65) Prior Publication Data

US 2012/0026679 A1 Feb. 2, 2012

(30) Foreign Application Priority Data

Jul. 29, 2010 (TW) ................................ 99125038 A

(51) Int. Cl.
*H05K 7/20* (2006.01)

(52) U.S. Cl. ........ 361/695; 361/690; 361/692; 361/694; 454/184

(58) Field of Classification Search ........................ None
See application file for complete search history.

(56) References Cited

U.S. PATENT DOCUMENTS

| | | | | |
|---|---|---|---|---|
| 4,774,631 A | * | 9/1988 | Okuyama et al. | 361/695 |
| 5,544,012 A | * | 8/1996 | Koike | 361/695 |
| 6,574,970 B2 | * | 6/2003 | Spinazzola et al. | 62/89 |
| 7,184,267 B2 | * | 2/2007 | Patel | 361/692 |
| 7,286,345 B2 | * | 10/2007 | Casebolt | 361/679.48 |
| 7,508,663 B2 | * | 3/2009 | Coglitore | 361/695 |
| 7,525,797 B2 | * | 4/2009 | Coglitore et al. | 361/679.46 |
| 7,916,470 B2 | * | 3/2011 | Mills et al. | 361/679.49 |
| 7,961,463 B2 | * | 6/2011 | Belady et al. | 361/695 |
| 2007/0173189 A1 | * | 7/2007 | Lewis | 454/184 |

* cited by examiner

*Primary Examiner* — Boris Chervinsky
(74) *Attorney, Agent, or Firm* — Altis Law Group, Inc.

(57) ABSTRACT

A data center includes a housing, a number of heat units arranged in the housing, and a fan mounted in the housing. When the data center runs, cool air comes into the housing through the front wall, the back wall, and the bottom wall of the housing, for cooling the heat units. The heated air is vented out of the housing through the top wall by the fan.

3 Claims, 3 Drawing Sheets

DATA CENTER

BACKGROUND

1. Technical Field

The present disclosure relates to a data center.

2. Description of Related Art

A data center usually includes a number of server modules arranged in a housing of a data center. The airflow for heat dissipating generally comes in from the front side of the server modules, and vents out through the back side of the server modules. As a result, the temperature at the back side of the server modules gets very high. Thus, operators cannot comfortably operate the data center near the back side of the housing.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
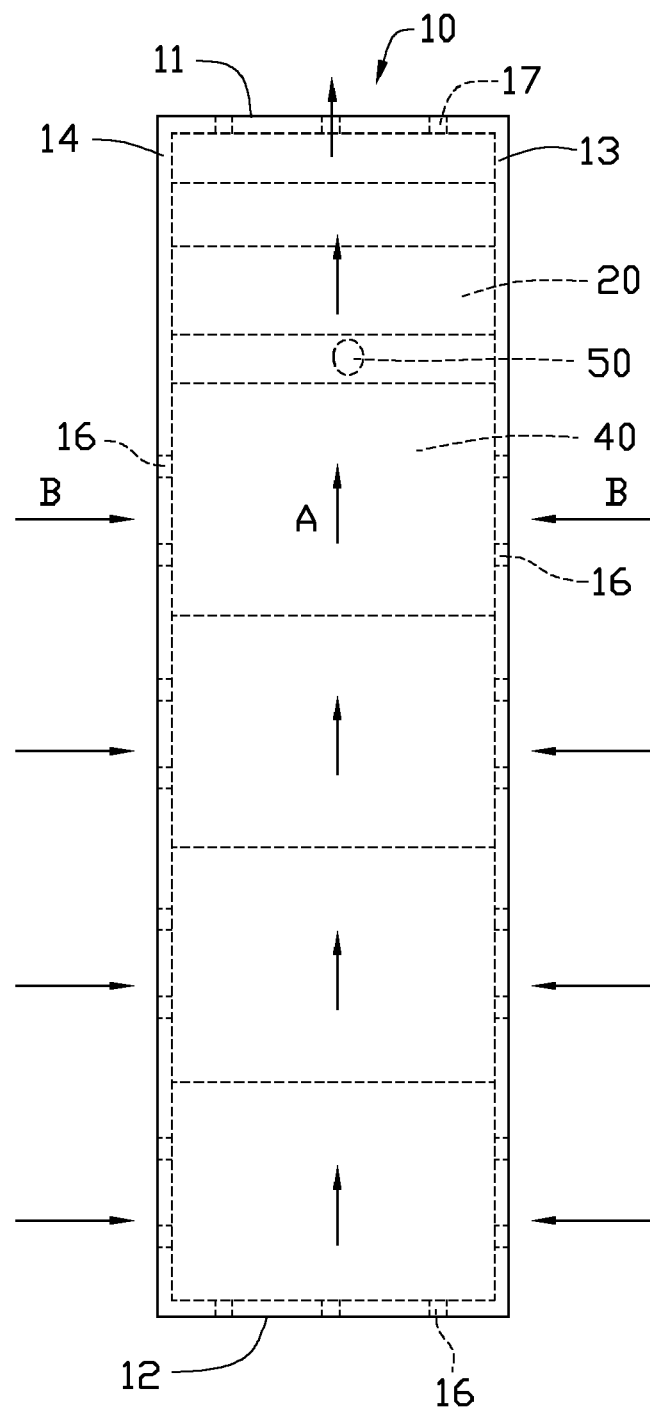
FIG. 1 is a side sketch view of an embodiment of a data center.
Figure 2:
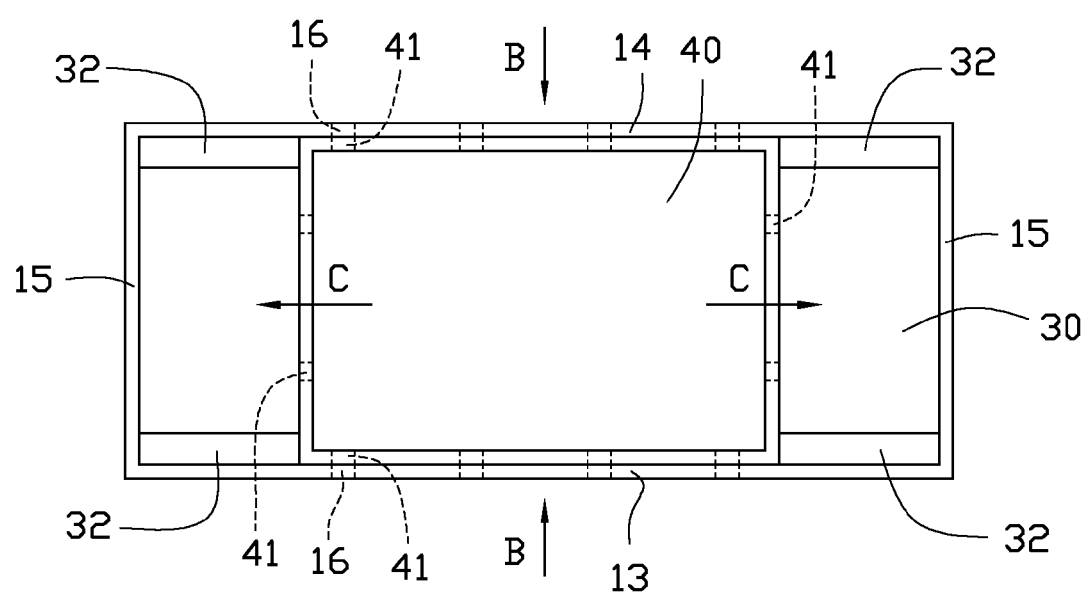
FIG. 2 is a top sketch view of the data center of FIG. 1.
Figure 3:
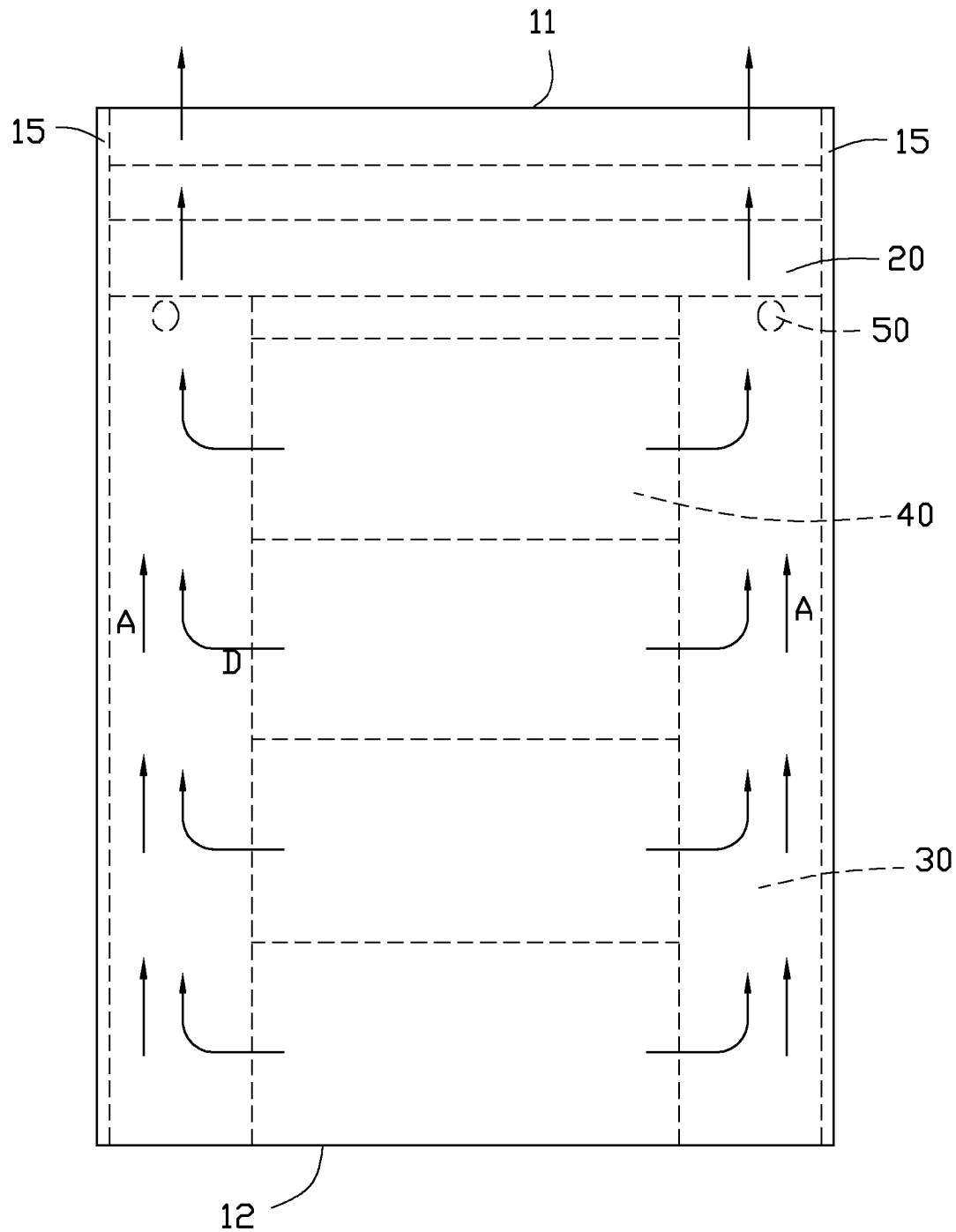
FIG. 3 is a front sketch view of the data center of FIG. 1.

Referring to FIG. 1 to FIG. 3, an exemplary embodiment of a data center includes a housing 10. The housing 10 includes a top wall 11, a bottom wall 12 opposite to the top wall, a front wall 13, a back wall 14 opposite to the front wall 13 and substantially parallel to the front wall 13, and opposite left and right sidewalls 15. The front wall 13, the back wall 14, and the bottom wall 12 define a number of through holes 16. A number of heat units 40, such as server modules, are heaped upright in the housing 10. The top wall 11 of the housing 10 defines a number of vents 17. A number of fans 20 are mounted in the housing 10 adjacent to and facing the vents 17 of the top wall 11. Each heat unit 40 defines a number of through holes 41 facing the front wall 13, the back wall 14, and left and right sidewalls 15 of the housing 10.

Airflow pipes 30 are formed between the heat units 40 and the left and right sidewalls 15 of the housing. Two plates 32 are arranged on the inner surfaces of the front wall 13 and the back wall 14 of the housing 10, and sandwich each airflow pipe 30.

When the data center runs, cool air comes into the housing 10 through the through holes 16 of the front wall 13, the back wall 14, and the bottom wall 12, respectively along B and A directions, for cooling the heat units 40. The heated air goes into the airflow pipes 30 along C and D directions, respectively, and is then vented out of the housing 10 through the vents 17 of the top wall 11 by the fans 20. The plates 32 are used for avoiding the heated air in the airflow pipes 30 to go back to the heat units 40. As a result, in the present disclosure, heated air is vented out of the housing 10 through the vents 17 of the top wall 11 but not through the front wall 13 or the back wall 14. That is to say, operators can operate the data center near the front wall 13 or the back wall 14 of the housing comfortably.

Furthermore, a number of temperature sensing elements 50 are arranged in the housing 10 adjacent to the fans 20, for sensing the temperature of the airflow near the fans 20, to control the rotation speed of the fans 20.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A data center comprising:
a housing comprising a top wall, a bottom wall opposite to the top wall, a front wall, a back wall opposite to the front wall, and opposite left and right sidewalls, wherein the front wall, the back wall, and the bottom wall define a plurality of through holes, the top wall defines a plurality of vents; and
a plurality of heat units arranged in the housing, wherein each heat unit defines a plurality of through holes facing the front wall, the back wall, and left and right sidewalls of the housing, airflow pipes are formed arranged between the plurality of heat units and the left and right sidewalls of the housing; and
a plurality of fans mounted in the housing, adjacent to and facing the plurality of vents of the top wall;
wherein when the data center runs, cool air comes into the housing through the plurality of through holes of the front wall, the back wall, and the bottom wall, for cooling the heat units, the heated air goes into the airflow pipes and is then vented out of the housing through the plurality of vents of the top wall by the plurality of fans.

2. The data center of claim 1, further comprising two plates arranged on inner surfaces of the front wall and the back wall of the housing to sandwich each airflow pipe, wherein the plates are used for avoiding the heated air in the airflow pipes to go back to the heat units.

3. The data center of claim 1, further comprising a plurality of temperature sensing elements arranged in the housing adjacent to the plurality of fans, for sensing the temperature of the airflow near the plurality of fans.

* * * * *